United States Patent [19]

Pfiester

[11] Patent Number: 5,047,812

[45] Date of Patent: Sep. 10, 1991

[54] INSULATED GATE FIELD EFFECT DEVICE

[75] Inventor: James R. Pfiester, Austin, Tex.

[73] Assignee: Motorola, Inc., Schaumburg, Ill.

[21] Appl. No.: 315,668

[22] Filed: Feb. 27, 1989

[51] Int. Cl.$^5$ .................. H01L 29/10; H01L 29/78; H01L 27/01; H01L 29/00

[52] U.S. Cl. .................. 357/23.4; 357/23.1; 357/23.3; 357/23.5; 357/55

[58] Field of Search .................. 357/23.4, 23.1, 23.3, 357/55, 23.5

[56] References Cited

U.S. PATENT DOCUMENTS

| 4,455,740 | 11/1984 | Iwai | 357/23.4 |
| 4,521,795 | 6/1985 | Coe et al. | 357/23.4 |
| 4,584,593 | 4/1986 | Tihanyi | 357/23.4 |

FOREIGN PATENT DOCUMENTS

| 53-084575 | 7/1978 | Japan | 357/23.4 |
| 53-141588 | 9/1978 | Japan | 357/23.4 |
| 54-121071 | 9/1979 | Japan | 357/23.4 |
| 60-004267 | 1/1985 | Japan | 357/23.5 |
| 60-038881 | 2/1985 | Japan | 357/23.5 |
| 60-189962 | 9/1985 | Japan | 357/23.4 |
| 61-089674 | 5/1986 | Japan | 357/23.4 |
| 62-071277 | 4/1987 | Japan | 357/23.5 |
| 62-108572 | 5/1987 | Japan | 357/23.4 |
| 63-015467 | 1/1988 | Japan | 357/23.4 |
| 63-141375 | 6/1988 | Japan | 357/23.4 |

OTHER PUBLICATIONS

Hockberg et al. "Fabrication of MOS Devices with Close Source Drain Spacing," IBM Tech. Discl. Bulletin, pp. 653–654, Oct. 1967.
Sai-Halasz et al., "Simple Realization of an Edge Doped FET," 11/6/83, p. 3025 of IBM Bulletin.
"Submicron 3D Surface-Orientation-Optimized CMOS Technology", Kinugawa, et al, 1986 VLSI Symposium Digest, pp. 17–18.

Primary Examiner—Andrew J. James
Assistant Examiner—Daniel Kim
Attorney, Agent, or Firm—Jasper W. Dockrey

[57] ABSTRACT

An insulated gate field effect device is disclosed having a channel region which includes both a horizontal and a vertical portion. The device is fabricated on a semiconductor substrate having a recess formed in its surface. The recess has a bottom forming a second surface with the wall of the recess extending between the first and second surfaces. A source region is formed at the first surface and a drain is formed at the second surface spaced apart from the wall. A channel region is defined along the wall and the second surface between the drain region and the source region. A gate insulator and gate electrode overlie the channel region.

7 Claims, 3 Drawing Sheets

INSULATED GATE FIELD EFFECT DEVICE

BACKGROUND OF THE INVENTION

This invention relates generally to an insulated gate field effect device and to a method for its fabrication, and more specifically to an insulated gate field effect device having horizontal and vertical channel components and to a method for fabricating such a device.

The trend in insulated gate field effect devices is to reduce the size of device features in order to build smaller and smaller integrated circuits using those devices. As device features, and especially the channel length of insulated gate field effect transistors (IGFETS) are reduced, a number of problems are encountered. These include, for example, the problem of patterning the small device features using conventional optical lithography. Additionally, device problems such as hot carrier injection and drain induced barrier lowering are encountered. These and other similar problems present obstacles to the goal of manufacturing inexpensive and yet reliable, high density, small geometry insulated gate field effect circuits.

Accordingly, a need existed for an improved device structure and for a method of fabrication which would overcome the problems of prior art structures and which would allow the fabrication of small, highly integrated devices without resort to unconventional lithography techniques.

It is therefore an object of this invention to provide an improved and reliable short channel insulated gate field effect transistor.

It is further object of this invention to provide an improved insulated gate field effect device having a mix of short channel devices and conventional devices.

It is a still further object of this invention to provide an improved process for fabricating insulated gate field effect devices.

BRIEF SUMMARY OF THE INVENTION

The foregoing and other objects and advantages of the invention are achieved with an insulated gate field effect device the channel of which has a vertical component and a horizontal component. In accordance with one embodiment of the invention, a device is provided which includes a semiconductor substrate having a first surface in which a recess is formed. The bottom of the recess defines a second surface and a wall of the recess extends between the first and second surfaces and is substantially perpendicular to the first surface. The device includes a source region formed at the first surface, a drain region formed at the second surface and spaced apart from the wall, and a channel region defined along the wall and the second surface between the drain region and the source region. A gate insulator and gate electrode overlie the channel region.

DETAILED DESCRIPTION OF PREFERRED EMBODIMENTS

FIGS. 1-4 illustrate schematically, in cross-section, process steps used to fabricate a device in accordance with one embodiment of the invention. In describing the inventive device and process, those device elements and process steps which are conventional in the art and which are not necessary to the full description of the invention will not be described or will be described only in general terms. The fabrication of only a portion of one device is illustrated. In actual practice, a large number of devices are fabricated simultaneously.

Figure 1:
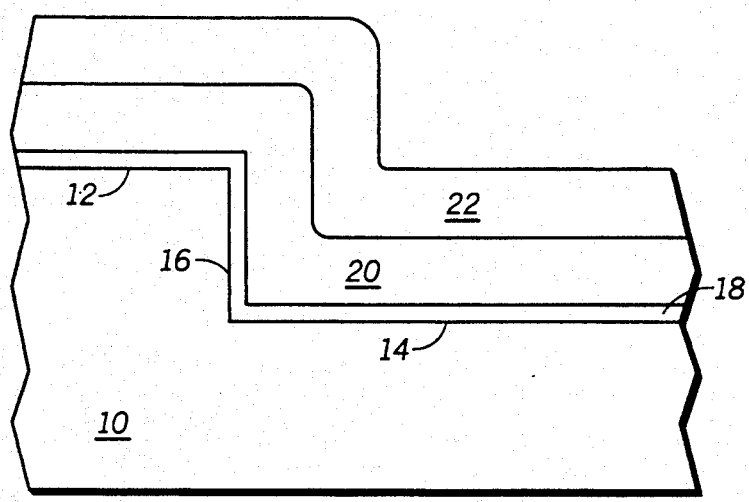
FIGS. 1-4 illustrate schematically, in cross-section, process steps in accordance with one embodiment of the invention.

As illustrated in FIG. 1, the process starts with a semiconductor wafer 10 such as a P-type monocrystalline silicon wafer. Wafer 10 has a flat, highly polished surface 12. A plurality of recesses are etched into surface 12, preferably by an anisotropic process such as reactive ion etching (RIE). Each recess has a bottom surface 14 and a wall 16 with the wall extending between surfaces 12 and 14. In the preferred embodiment, the anisotropic etch produces a wall 16 which is substantially perpendicular to the original surface 12.

A gate insulator 18 is formed overlying the structure, including the surfaces 12 and 14 and wall 16. Gate insulator 18 is preferable a layer of thermally grown silicon dioxide having a thickness of about 10-25 nanometers. A layer of gate electrode forming material 20 is deposited overlying gate insulator 18, and a layer of sidewall spacer forming material 22 is deposited over the gate electrode forming material. In a preferred embodiment, gate electrode forming material 20 is polycrystalline silicon and spacer forming material 22 is silicon nitride or silicon oxide.

Figure 2:
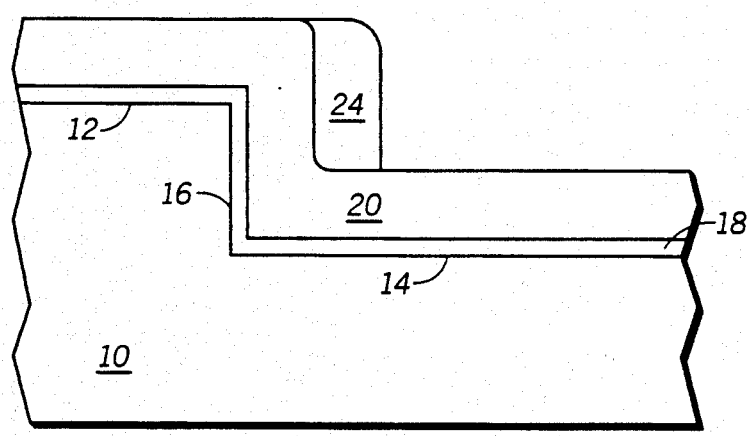

Layer 22 of sidewall spacer forming material is anisotropically etched to form a sidewall spacer 24 as illustrated in FIG. 2. The width of sidewall spacer 24 is determined by the thickness of the layer of sidewall spacer forming material.

Figure 3:
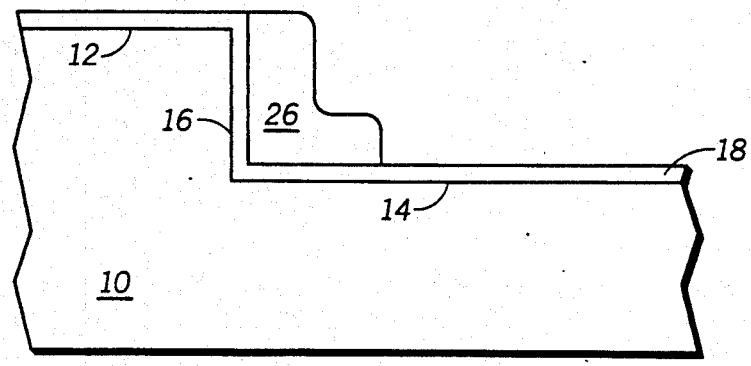

Layer 20 of gate electrode forming material is anisotropically etched using sidewall spacer 24 as an etch mask. The resultant structure, as illustrated in FIG. 3, is an L-shaped gate electrode 26. Gate electrode 26 is positioned to overlie vertical wall 16 as well as a portion of horizontal surface 14 at the bottom of the recess etched in substrate 10.

After patterning L-shaped gate electrode 26, a source region 28 and a drain region 30 are formed in substrate 10 using gate electrode 26 as an impurity doping mask. For example, source region 28 and drain region 30 can be formed by ion implantation of an N-type dopant such as phosphorus or arsenic. During the ion implantation step, gate insulator 18 can be retained on the substrate and used as an implant oxide, or it can be replaced by a dedicated implant pad oxide. If the source and drain regions are formed by a thermal diffusion or other process, the gate insulator may have to be removed before the impurity doping step is carried out successfully.

Figure 4:
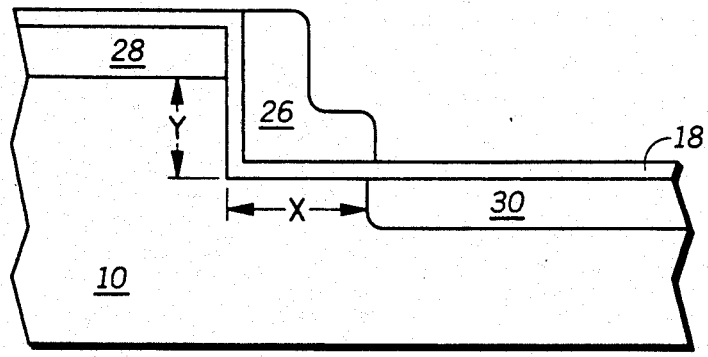

The structure illustrated in FIG. 4, in accordance with the invention, includes a source region 28 formed at the original surface of substrate 10, a drain region 30 formed at the bottom of the recess, and a channel region extending between the source and drain regions and including a portion of wall 16 and a portion of second surface 14. Overlying the channel region is a gate insulator 18 and a gate electrode 26. The L-shape of gate electrode 26, as illustrated in this schematic illustration, leads to the name "L-gate IGFET" for the transistor so formed. The channel region of the insulated gate field effect transistor includes a horizontal portion x and a vertical portion y. Neither of these portions is limited by the limits of optical lithography. The horizontal channel length x is determined by the thickness of the material forming gate electrode 26 and by the thickness of spacer 24 used to pattern that gate electrode. The length of the vertical portion y of the channel is determined by the depth of the recess etched into substrate 10 and by the junction depth of source region 28.

In fabricating the structure illustrated in FIG. 4, relatively deep source/drain junctions can be utilized without seriously impacting the channel length as is normally the situation with conventionally fabricated insulated gate field effect transistors. The relatively deep source/drain junctions provide for low junction leakage because the junction depth can be made greater than the damage zone resulting from the implant. Additionally, heavily doped phosphorus (or boron in the case of a P-channel device) junctions can be fabricated without the requirement for a preamorphizing implant. Additionally, the deep drain junction results in decreased hot carrier injection because the deep junction has a graded doping profile. In contrast to a conventional device, in addition to reducing hot carrier injection, the drain induced barrier lowering is also reduced because the drain region is displaced from the corner by a distance x.

As a specific, but non-limiting example, a P-type silicon substrate having a resistivity of about 10-20 ohm cm is implanted with boron at a dose of about $1-2 \times 10^{12}$ at an energy of about 30-60 KeV to provide the correct channel region doping for the vertical portion of the device to be fabricated. Recesses are then etched into the surface of the substrate to a depth of about 0.5-1.0 micrometer using reactive ion etching to achieve nearly vertical walls of the etched recesses. Isolation between individual devices (not shown in the FIGURES) is achieved using a standard local oxidation process, although any other type of interdevice isolation technique can also be used. A gate oxide of about 10 nanometers thickness is then grown over the surface of the substrate, the walls of the recess, and the bottom surface of the recess by thermal oxidation in dry oxygen at a temperature of about 900° C. Thereafter a first thin layer of polycrystalline silicon having a thickness of about 50 nanometers is deposited on the gate insulator. A channel region doping implant is then performed with boron impurity ions implanted through the thin layer of polycrystalline silicon and into the underlying substrate to achieve the correct channel doping for the horizontal portion of the transistor channel. This implant is performed selectively using photoresist as an implant mask. The implant adjusts the threshold voltage of the horizontal portion of the device as well as any conventional planar devices which are used elsewhere in the circuit. After the channel doping implant, a second polycrystalline silicon layer having a thickness of about 300 nanometers is deposited over the first polycrystalline silicon layer to achieve the desired total thickness of about 350 nanometers. A layer of silicon nitride having a thickness of about 300 nanometers is then deposited over the second layer of polycrystalline silicon. This layer, which has a thickness generally in the range of 200-400 nanometers, can be formed of deposited silicon nitride or, alternatively, a deposited low temperature oxide, aluminum, or other masking material. The silicon nitride is reactive ion etched to form a sidewall spacer on that portion of polycrystalline silicon which overlies the wall of the recess. The polycrystalline silicon, in turn, is reactive ion etched using the sidewall spacer as an etch mask to form the L-shaped polycrystalline silicon gate electrode. The sidewall spacer may be removed by wet etching or other means, or, alternatively, the spacer can be left in place. Source and drain regions are implanted using phosphorus or arsenic. This implantation is masked by the polycrystalline silicon gate electrode which is implanted at the same time to achieve a high conductivity gate electrode. The processing continues thereafter with standard processing steps.

The process described above illustrates the fabrication of an N-channel insulated gate field effect transistor. The same process can be used to form P-channel resistors with the appropriate change in doping type. Additionally, CMOS transistors can be made by selectively using photoresist masking to individually dope N-type and P-type regions.

Figure 5:
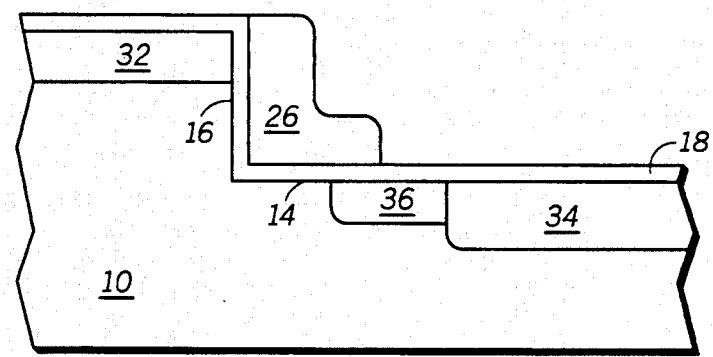
FIGS. 5-8 illustrate schematically, in cross-section, further embodiments of the invention.
Figure 6:
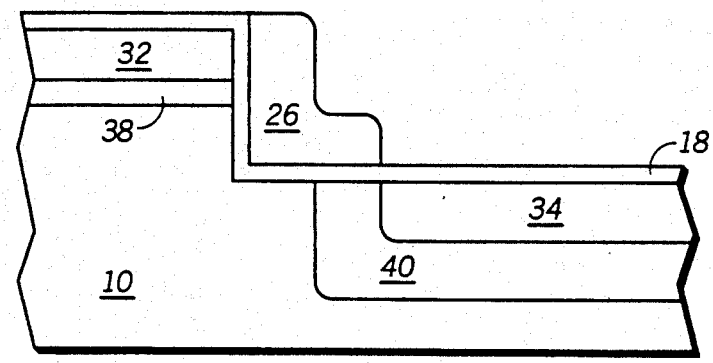

FIGS. 5-8 illustrate further embodiments of the invention. FIGS. 5 and 6, for example, illustrate variations in the drain and source impurity doped regions. In each of these FIGURES the gate electrode structure is the same as that found in FIG. 4. In FIG. 5, the device illustrated includes an asymmetrical lightly doped drain (LDD) structure. The device includes a heavily doped source region 32, a heavily doped drain region 34, and a lightly doped drain region 36. The heavily doped drain region is spaced apart from the gate electrode and the lightly doped drain region is aligned with and slightly overlapped by gate electrode 26. The structure is fabricated by providing a sidewall spacer on gate electrode 26 including that portion of the electrode which lies along the second surface 14. Using the sidewall spacer as an impurity doping mask, the heavily doped source region 32 and drain region 34 are formed by ion implantation, thermal diffusion, or the like. Lightly doped drain region 36 is formed, without the sidewall spacer on gate electrode 26, by an unmasked low concentration diffusion or ion implantation to form a junction which is more shallow than the junction formed by the heavily doped source and drain regions. The diffusion or ion implantation which forms lightly doped region 36 thus also forms a similar region totally within the heavily doped source region 32.

In contrast to the structure of FIG. 5, the structure illustrated in FIG. 6 is a more symmetrical LDD structure. The structure is formed to have heavily doped source and drain region 32 and 34, respectively, and also a lightly doped source region 38 and a lightly doped drain region 40. The lightly doped source and drain regions can be formed with or without the use of a sidewall spacer which will space heavily doped drain region 34 away from gate electrode 26, as desired. The lightly doped regions 38 and 40 are formed by a low concentration implantation or diffusion which has a junction deeper than the junctions of the heavily doped regions 32 and 34. Thus one ion implantation or diffusion step is used to form the heavily doped regions and another ion implantation or diffusion step is used to simultaneously form lightly doped region 38 and 40.

Figure 7:
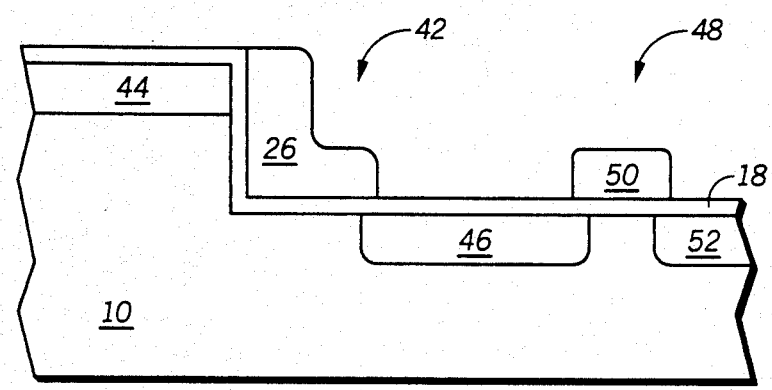
Figure 8:
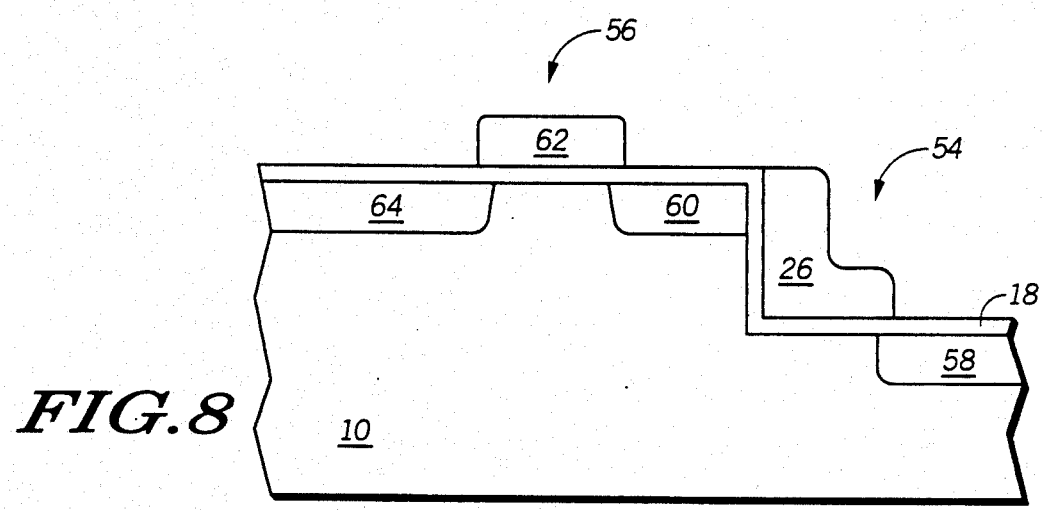

FIGS. 7 and 8 illustrate two embodiments in which an L-gate device is combined with a conventional device. In FIG. 7 the integrated structure includes an L-gate device 42 having a gate electrode 26, a source region 44, a drain region 46, and a gate insulator 18. The integrated structure further includes a conventional insulated gate field effect transistor 48 having a gate electrode 50, a drain region 52, and a source region which is in common with drain region 46 of device 42. In this embodiment the conventional insulated gate field effect transistor is formed at the second surface at the bottom of the recess in substrate 10. Device 48 is made in conventional manner without any additional processing steps.

FIG. 8 illustrates a further embodiment of the invention in which a conventional insulated gate field effect transistor 56 is combined with an L-gate device 54. L-gate device 54 includes a gate electrode 26, gate insulator 18, drain region 58, and a source region 60 which is common with a drain region of conventional device 56. Device 56 further includes a gate electrode 62 and a source region 64. In this embodiment the conventional device 56 is formed at the original first surface of substrate 10.

It is thus apparent that there has been provided, in accordance with the invention, an insulated gate field effect transistor and method for its fabrication which fully meet the objects and advantages set forth above. The invention has been described and illustrated with reference to specific embodiments thereof, but it is not intended that the invention be limited to these illustrative embodiments. Those skilled in the art will appreciate that variations and modifications can be made without departing from the spirit of the invention. For example, the doping in the vertical portion of the device channel can be doped by ion implantation or the like prior to the etching of the recess or can be determined by the doping of the substrate itself. In addition, the doping of the horizontal portion of the device channel can also be adjusted by a separate ion implantation step independently of the implantation used to adjust doping in the other portion of the channel. Still further, the two portions of the L-shaped gate electrode can be independently doped. For example, the gate electrode material can be lightly doped with either P-type or N-type impurities by in situ doping during the deposition of the gate electrode material. The horizontal portion of the L-shaped gate electrode can then be more heavily doped or can be counter-doped in a separate implantation step. Although the illustrative embodiments have generally referred to an N-channel device having a polycrystalline silicon gate electrode, the devices can be N-type, P-type, or CMOS and the gate electrode can be polycrystalline silicon, refractory metal, silicide, or the like. It is intended to encompass within the invention all such variations and modifications as fall within the scope of the appended claims.

I claim:

1. An insulated gate field effect device comprising:
   a semiconductor substrate having a first surface;
   a recess in said first surface, the bottom of said recess defining a second surface, and a wall of said recess extending from said first surface to said second surface;
   a first transistor formed in said substrate and comprising a source region formed at said first surface;
   a drain region comprising a first heavily doped region formed at said second surface and spaced apart from said wall;
   a channel region defined along said wall and said second surface between said drain region and said source region;
   a gate insulator overlying said channel region; and a gate electrode overlying said gate insulator and portions of second surface and said wall.

2. The device of claim 1 wherein said drain region further comprises a second lightly doped region which extends closer to said wall than does said first heavily doped region.

3. The device of claim 2 wherein said second lightly doped region extends deeper into said substrate in a direction away from said first surface than does said first heavily doped region.

4. The device of claim 2 wherein said first heavily doped region extends deeper into said substrate in a direction away from said first surface than does said second lightly doped region.

5. The device of claim 2 wherein said source region comprises a single heavily doped region.

6. The device of claim 1 further comprising a second transistor coupled to said first transistor, said second transistor comprising: second source and drain regions and a second channel region extending therebetween formed at said first surface.

7. The device of claim 1 further comprising a second transistor coupled to said first transistor, said second transistor comprising: second source and drain regions and a second channel region extending therebetween formed at said second surface.

* * * * *